United States Patent [19]
Fodali

[11] Patent Number: 5,898,299
[45] Date of Patent: Apr. 27, 1999

[54] PROBE TYPE TESTER WITH CIRCUIT BOARD STABILIZER

[75] Inventor: Adolph Fodali, Lake Hiawatha, N.J.

[73] Assignee: S&G Tool Aid Corp., Newark, N.J.

[21] Appl. No.: 08/667,743

[22] Filed: Jun. 21, 1996

[51] Int. Cl.⁶ .................................................. G01R 1/06
[52] U.S. Cl. ........................ 324/149; 324/72.5; 439/482
[58] Field of Search .................................. 324/179, 72.5, 324/754, 149; 439/482

[56] References Cited

U.S. PATENT DOCUMENTS

| | | |
|---|---|---|
| 3,798,541 | 3/1974 | Campbell ................................ 324/149 |
| 3,829,763 | 8/1974 | Morin . |
| 4,028,621 | 6/1977 | Bloxam . |
| 4,740,745 | 4/1988 | Sainz . |
| 4,884,033 | 11/1989 | McConchie, Sr. . |
| 5,001,432 | 3/1991 | Wixon . |
| 5,107,426 | 4/1992 | McGinty et al. . |
| 5,168,238 | 12/1992 | Larance . |
| 5,220,274 | 6/1993 | Nightingale ............................. 324/149 |
| 5,270,638 | 12/1993 | Mellott . |

*Primary Examiner*—Ernest F. Karlsen
*Assistant Examiner*—Jose M. Solis
*Attorney, Agent, or Firm*—Robert L. Epstein; Harold James; James & Franklin

[57] ABSTRACT

The hand held circuit tester includes a hollow handle. A probe extends from one end of the handle. First and second leads extend from the other. An LED carrying circuit board is situated within the handle. One end of the circuit board is connected to the probe by a spring. The other end is connected to the leads. A "U" shaped collar is received within slots in the circuit board in a position perpendicular to the plane of the circuit board. The collar edge abuts the edge of one of the handle parts to stabilize the circuit board relative to the handle.

9 Claims, 2 Drawing Sheets

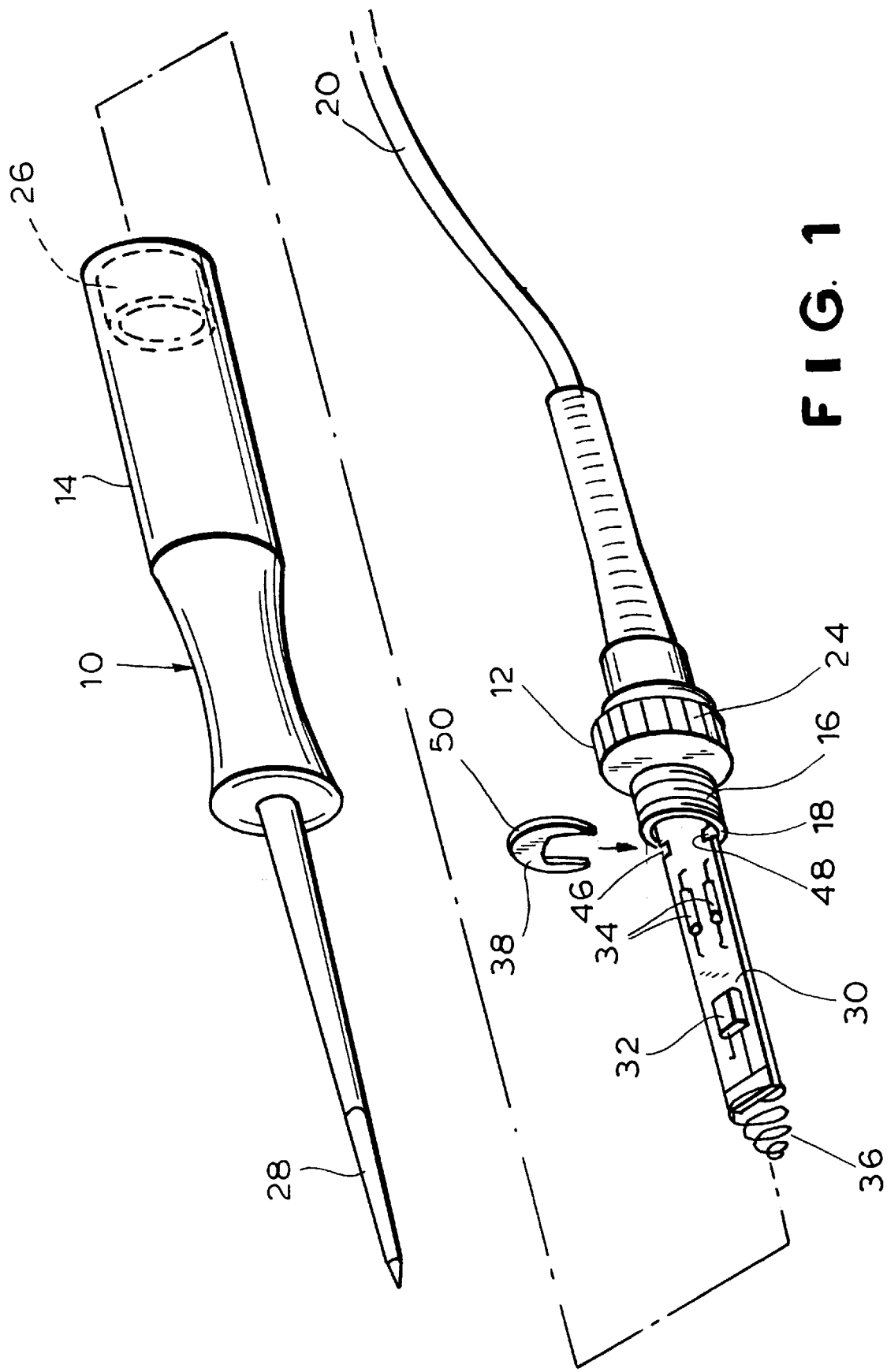

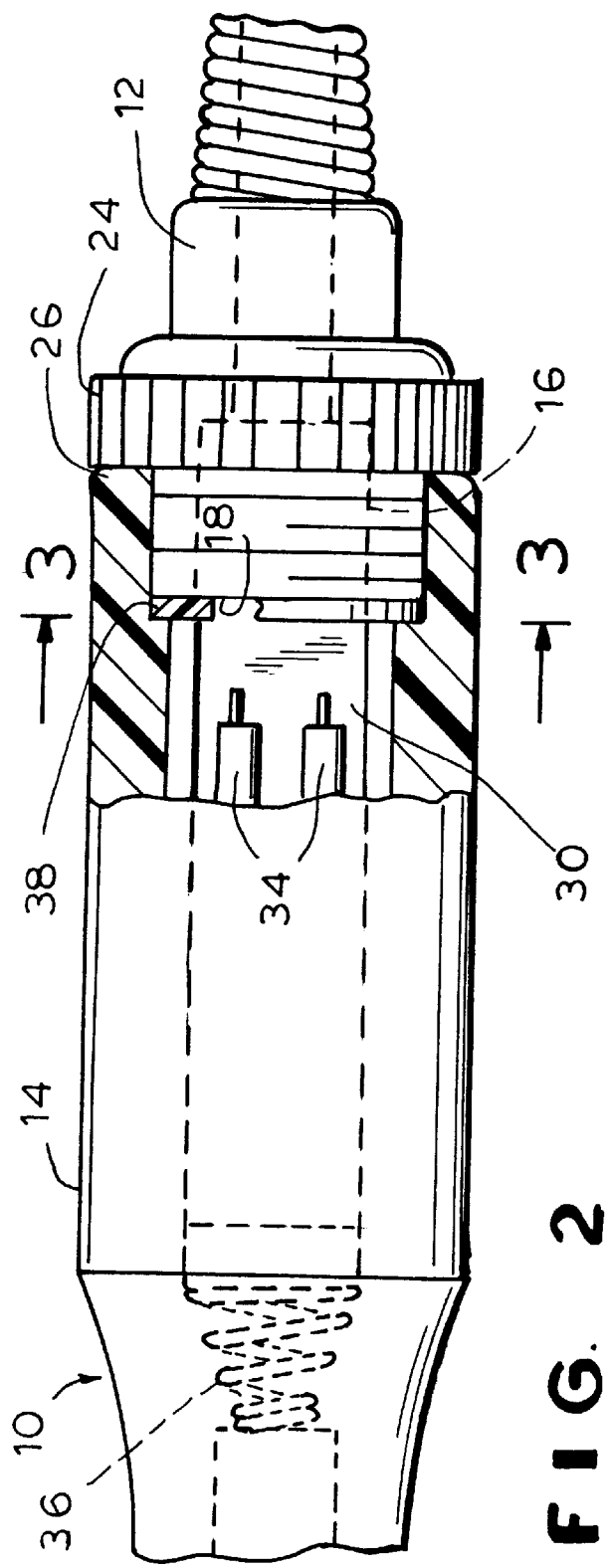
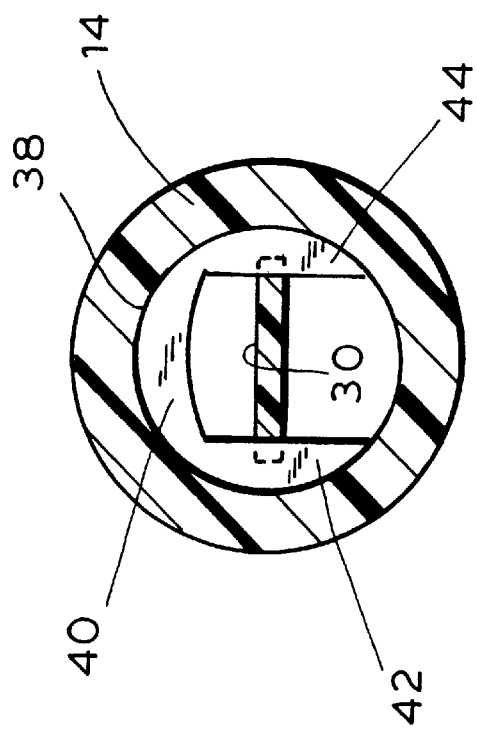

PROBE TYPE TESTER WITH CIRCUIT BOARD STABILIZER

The present invention relates to probe type electrical circuit testers and more particularly to a stabilizer for the circuit board of such a tester.

Probe type circuit testers, designed for automative and other uses, are well known in the art. Morin U.S. Pat. No. 3,829,763 issued Aug. 13, 1974, Sainz U.S. Pat. No. 4,740,745 issued Apr. 26, 1998 and Wixon U.S. Pat. No. 5,001,432 all relate to such testers, which include a single lead. Bloxam U.S. Pat. No. 4,028,621 issued Jun. 7, 1977 and Mellott U.S. Pat. No. 5,270,638 issued Dec. 14, 1993 disclose two lead testers of this type.

Many of the probe testers include a hollow clear plastic handle from which the probe extends and within which is situated the circuit board. The circuit board carries one or more LED's and various other electrical devices, such as resisters, which make up the components of the test circuit. Normally, the LED will be energized when the probe and/or leads contact an electrical source so as to complete a circuit. Different color LED's may be provided to indicate sources of different polarity.

The handle includes a base part with an externally threaded cylindrical portion through which the lead or leads extend. The other part of the handle carries the probe and includes a hollow cylindrical circuit board receiving part. The circuit board receiving part has an opening adapted to receive the base part. It has an internally threaded portion adapted to engage the threads on the base.

A spring of electrically conductive material is interposed between one end of the circuit board and the probe. The spring has a dual purpose. It electrically connects the probe and the circuit board. It also urges the circuit board toward the base.

One of the problems often encounted with the above structure relates to the fact that the circuit board is not securely anchored to the handle. Because of this, the lead or leads may flex or bend at or near the connection point with the circuit board causing the circuit board to change position relative to the handle during use. This change in position may reduce the contact between the leads and the circuit board resulting in a loss of reliability.

It is therefore a prime object of the present invention to provide a stabilizer for the circuit board in a probe type electrical tester which maintains the position of the circuit board relative to the handle regardless of the movement of the leads or orientation of the tester.

In accordance with the present invention, a circuit tester is provided which includes a hollow handle with a probe extending from a first end and a lead extending from a second end. A circuit board is situated within the handle. The circuit board includes a first and a second end. Electrically conductive spring means are interposed between and operably connected to the first board end and the probe. The spring means urges the circuit board toward the second handle end. The second board end is operably connected to the lead. Means cooperating with the circuit board and the handle are provided for stabilizing the position of the board relative to the handle.

The stabilizing means comprises a collar. The collar is substantially "U" shaped. It is oriented in a direction substantially perpendicular to the plane of the circuit board.

The circuit board includes a slot. The collar is received in the slot. Preferrably, the circuit board includes first and second slots and the collar is received in both slots.

The handle includes a part with an edge. The collar abuts the edge. The part with the edge includes a cylindrical portion. The edge includes the rim of the cylindrical portion. The cylindrical portion is externally threaded. A second handle part is provided. The probe is mounted on the second handle part. The second handle part has an internally threaded portion adapted to mate with the externally threaded portion of the first handle part.

To these and to such other objects which may hereinafter appear, the present invention relates to a probe type tester with a circuit board stabilizer, as set forth in detail in the following specification and recited in the annexed claims, taken together with the accompanying drawings, wherein like numbers refer to like parts and in which:

FIG. 1 is an exploded isometric view of the tester of the present invention;

FIG. 2 is a fragmentary plan view of the tester partially broken away; and

FIG. 3 is an enlarged plan view of the collar taken along line 3—3 of FIG. 2.

As seen in the drawings, the tester of the present invention comprises a cylindrical handle, generally designated 10, formed of an opaque base part 12 and a clear plastic hollow cylindrical part 14.

Base 12 has an externally threaded cylindrical section 16 with a rim or shoulder 18 defining an internal recess into which wire leads 20, 22 extend. Base 12 also has an externally knurled part 24 for gripping the base as part 14 is mounted thereon.

Part 14 has an internally threaded part 26 at one end which is adapted to receive and engaged part 16 of the base therein. Probe 28 extends out the other end of part 14.

A circuit board 30 is situated within part 14. Board 30 carries an LED 32 and other electrical components of the tester, such as resisters 34.

A spring 36, made of electrically conductive material, electrically connects one end of board 30 with probe 28. Spring 36 also serves to urge board 36 toward part 14. The other end of board 36 is connected to leads 20, 22.

A collar 38 is provided to stabilize the circuit board relative to the handle. Collar 38 cooperates with board 36 and base 10 to anchor the board within the handle. More particularly, as best seen in FIG. 3, collar 38 is disk-like, having a generally "U" shaped configuration with a central portion 40 and first and second spaced arms 42, 44.

Board 36 is provided with first and second slots 46, 48 each wide enough to accomodate the width of the collar. Arms 42, 44 are received in slots 46, 48 respectively. Collar 38 is situated in a plane generally perpendicular to the plane of circuit board 30.

Collar 38 has an arcuate edge portion 50. Portion 50 abuts rim 18 when base 10 is received in part 14. The action of spring 36 presses edge portion 50 against rim 18. This maintains the circuit board in a plane perpendicular to the plane of rim 18.

When the components of the tester are assembled, as shown in FIG. 1, collar 38 cooperates with the circuit board 30 and base 12 to stabilize the board relative to the handle in a position alone the axis of the handle. Thus, flexing or bending of the wire leads cannot result in movement of the board relative to the handle.

It will now be appreciated that the present invention relates to a collar which serves to stabilize the circuit board within the handle of a probe type electrical tester. The resulting product has enhanced reliability.

While only a single prefered embodiment of the present invention has been disclosed for purposes of illustration, it is obvious that many variations and modifications could be made thereto. It is intended to cover all of these variations and modifications which fall within the scope of the present invention as disclosed by the following claims:

I claim:

1. A circuit tester comprising a hollow handle with a probe extending from a first end and a lead extending from a second end, a circuit board situated within said handle, said circuit board comprising a first and a second end, electrically conductive spring means interposed between and operably connecting said first board end and said probe, said spring means urging said circuit board toward said second handle end, said second board end being operably connected to said lead and means cooperating with said circuit board and said handle for stabilizing the position of said board relative to said handle, said stabilizing means comprising a collar.

2. The tester of claim 1 wherein said collar is substantially "U" shaped.

3. The tester of claim 1 wherein said circuit board comprises a slot and wherein said collar is received in said slot.

4. The tester of claim 1 wherein said circuit board comprises first and second slots and wherein said collar is received in said first and second slots.

5. The tester of claim 1 wherein said handle comprises a part with a rim and wherein said collar abuts said rim.

6. The tester of claim 5 wherein said part comprises a cylindrical portion and said rim comprises the edge of said cylindrical portion.

7. The tester of claim 5 wherein said spring means urges said collar toward said rim.

8. The tester of claim 6 wherein said cylindrical portion is externally threaded and further comprising a second handle part to which said probe is mounted, said second handle part having an internally threaded portion adapted to engage said externally threaded portion.

9. The tester of claim 1 wherein said collar is mounted on said circuit board in a plane perpendicular to the plane of said circuit board.

* * * * *